US012677380B2

(12) United States Patent
Caplan et al.

(10) Patent No.: US 12,677,380 B2
(45) Date of Patent: Jul. 7, 2026

(54) REMOVABLE LID FOR FLIP CHIP-BALL GRID ARRAY (FC-BGA) PACKAGES

(71) Applicant: Mellanox Technologies, Ltd., Yokneam (IL)

(72) Inventors: Eitan Ariel Caplan, Haifa (IL); Yogev Buzaglo, Kiryat Ata (IL); Ilan Avraham Langut, Yuvalim (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 609 days.

(21) Appl. No.: 18/110,639

(22) Filed: Feb. 16, 2023

(65) Prior Publication Data

US 2024/0284603 A1 Aug. 22, 2024

(51) Int. Cl.
*H05K 3/341* (2026.01)
*H10W 76/15* (2026.01)
(Continued)

(52) U.S. Cl.
CPC .......... *H05K 3/3436* (2013.01); *H10W 76/15* (2026.01); *H05K 1/181* (2013.01); *H05K 2201/10734* (2013.01); *H05K 2203/0195* (2013.01); *H05K 2203/304* (2013.01); *H10W 90/701* (2026.01)

(58) Field of Classification Search
CPC ....... H01L 21/18; H01L 21/326; H01L 21/50; H01L 23/00; H01L 23/02; H01L 23/053; H01L 23/28; H01L 23/498; H01L 23/49816; H01L 23/562; H10D 48/04; H10D 48/07; H05K 1/18; H05K 1/181;

H05K 3/303; H05K 3/34; H05K 3/3436; H05K 2201/10734; H05K 2203/0195; H05K 2203/304; H05K 3/32; H05K 3/341; H10W 42/00; H10W 42/121; H10W 74/00; H10W 76/15; H10W 90/00; H10W 90/701; H10W 95/00
See application file for complete search history.

(56) References Cited

U.S. PATENT DOCUMENTS 6,276,598 B1   8/2001   Cheng et al.
10,242,941 B1   3/2019   Su et al.
(Continued)

FOREIGN PATENT DOCUMENTS

TW        201448699 A     12/2014
WO      2006109407        10/2006

*Primary Examiner* — Brook Kebede
(74) *Attorney, Agent, or Firm* — ALSTON & BIRD LLP

(57) ABSTRACT

Assemblies, systems, and methods are described herein for a removable lid for flip chip-ball grid array (FC-BGA) packages. An example removable lid assembly for an integrated circuit (IC) package includes at least one pedestal configured to be attached to a substrate, a lid configured to be reversibly secured to the at least one pedestal, and a plurality of fasteners configured to reversibly secure the lid to the at least one pedestal. In an installed state of the removable lid assembly in which the removable lid assembly is attached to the substrate, the lid is spaced from the substrate and the electrical components of the substrate. In the installed state, the removable lid assembly enhances a stiffness of the substrate, thereby reducing warpage of the substrate during a reflow process applied to the substrate. Corresponding systems and methods are also provided.

20 Claims, 13 Drawing Sheets

(51) Int. Cl.
    *H05K 1/181*        (2026.01)
    *H10W 90/00*      (2026.01)

(56)                References Cited

U.S. PATENT DOCUMENTS

| | | | |
|---|---|---|---|
| 10,849,238 B1 | 11/2020 | Buzaglo | |
| 2017/0092619 A1* | 3/2017 | Refai-Ahmed | H01L 23/04 |
| 2017/0372979 A1* | 12/2017 | Gandhi | H01L 23/3675 |
| 2018/0068917 A1* | 3/2018 | Iruvanti | H01L 23/10 |

* cited by examiner

REMOVABLE LID FOR FLIP CHIP-BALL GRID ARRAY (FC-BGA) PACKAGES

TECHNOLOGICAL FIELD

Example embodiments of the present disclosure relate generally to structures for reducing warpage of a substrate of an integrated circuit package, particularly for flip chip-ball grid array (FC-BGA) packages.

BACKGROUND

As the manufacturing process for integrated circuits continues to evolve in complexity, methods of production have similarly evolved to match the growing needs. In production of integrated circuits where a reflow process may be used, warpage of the integrated circuit may cause damage and/or may otherwise impair the proper operation of the integrated circuit. Applicant has identified a number of deficiencies and problems associated with the conventional reflow manufacturing process. Through applied effort, ingenuity, and innovation, many of these identified problems have been solved by developing solutions that are included in embodiments of the present disclosure, many examples of which are described in detail herein.

BRIEF SUMMARY

Embodiments of the present disclosure are directed for a removable lid for flip chip ball grid array (FC-BGA) packages. In some embodiments, the removable lid assembly for an integrated circuit (IC) package may include at least one pedestal configured to be attached to a substrate. The substrate may be configured to support electrical components. The removable lid assembly may further include a lid configured to be reversibly secured to the at least one pedestal, and a plurality of fasteners configured to reversibly secure the lid to the at least one pedestal. When the removable lid assembly is attached to the substrate, the lid may be in an installed state and may be spaced from the electrical components of the substrate. The removable lid assembly in the installed state may further enhance a stiffness of the substrate, thereby reducing warpage of the substrate during a reflow process applied to the substrate.

In some embodiments, the lid at least partially covers the substrate in the installed state.

In some embodiments, the lid defines a central body and a plurality of support members extending from the central body. The plurality of support members may be configured to extend to an outer edge of the substrate in the installed state.

In some embodiments, the central body of the lid defines an opening configured to overlie and allow access to a central portion of the substrate in the installed state.

In some embodiments, the central body of the lid is configured to constrain warpage of a central portion of the substrate in the installed state through direct contact.

In some embodiments, the lid fully covers the substrate in the installed state.

In some embodiments, the at least one pedestal comprises a plurality of pedestals.

In some embodiments, the at least one pedestal is configured to be bonded to the substrate prior to the lid being reversibly secured to the at least one pedestal.

In some embodiments, the at least one pedestal is configured to be removed from the substrate following the application of the reflow process.

In some embodiments, the removable lid assembly is compatible with co-packaged optic (CPO) and co-packaged copper (CPC) packages.

In some embodiments, the reflow process is a ball grid array (BGA) reflow process.

A method of manufacturing an electronic apparatus is also provided according to some embodiments. The method may include providing a substrate and assembling an IC package. The IC package may be assembled by connecting electrical components to the substrate, attaching at least one pedestal to the substrate, and reversibly securing a lid to the at least one pedestal. The removable lid assembly may enhance a stiffness of the substrate, thereby reducing warpage of the substrate during the reflow process that is applied to the substrate.

In some embodiments, the reflow process comprises a reflow process for co-packaged optics (CPO) and co-packaged copper (CPC).

In some embodiments, the removable lid is configured to constrain warpage of the IC package.

In some embodiments, the lid may be removed following completion of the reflow process.

In some embodiments, the lid defines a central body and a plurality of support members extending from the central body. The plurality of support members may be configured to extend to an outer edge of the substrate.

In some embodiments, the at least one pedestal may be configured to be bonded to the substrate prior to the lid being reversibly secured to the at least one pedestal.

A system configured to enable ball grid array (BGA) reflow on an IC package is also provided according to some embodiments. The system may comprise a substrate, electrical components supported by the substrate, and a removable lid assembly attached to the substrate. The removable lid assembly may comprise at least one pedestal configured to be attached to the substrate, a lid configured to be reversibly secured to the at least one pedestal, and a plurality of fasteners configured to reversibly secure the lid to the at least one pedestal. The IC package may be formed from a substrate, the electrical components, and the removable lid assembly. The lid may be spaced from the electrical components. The removable lid assembly may enhance a stiffness of the IC package, thereby reducing warpage of the substrate during a reflow process applied to the IC package.

In some embodiments, the system may further comprise a printed circuit board (PCB). The PCB may be configured to attach and communicate electronically with the IC package.

In some embodiments, the lid may be removed from the removable lid assembly following attachment of the IC package to the PCB.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the disclosure in general terms above, reference will now be made the accompanying drawings. The components illustrated in the figures may or may not be present in certain embodiments described herein. Some embodiments may include fewer (or more) components than those shown in the figures.

DETAILED DESCRIPTION

Figure 1A:
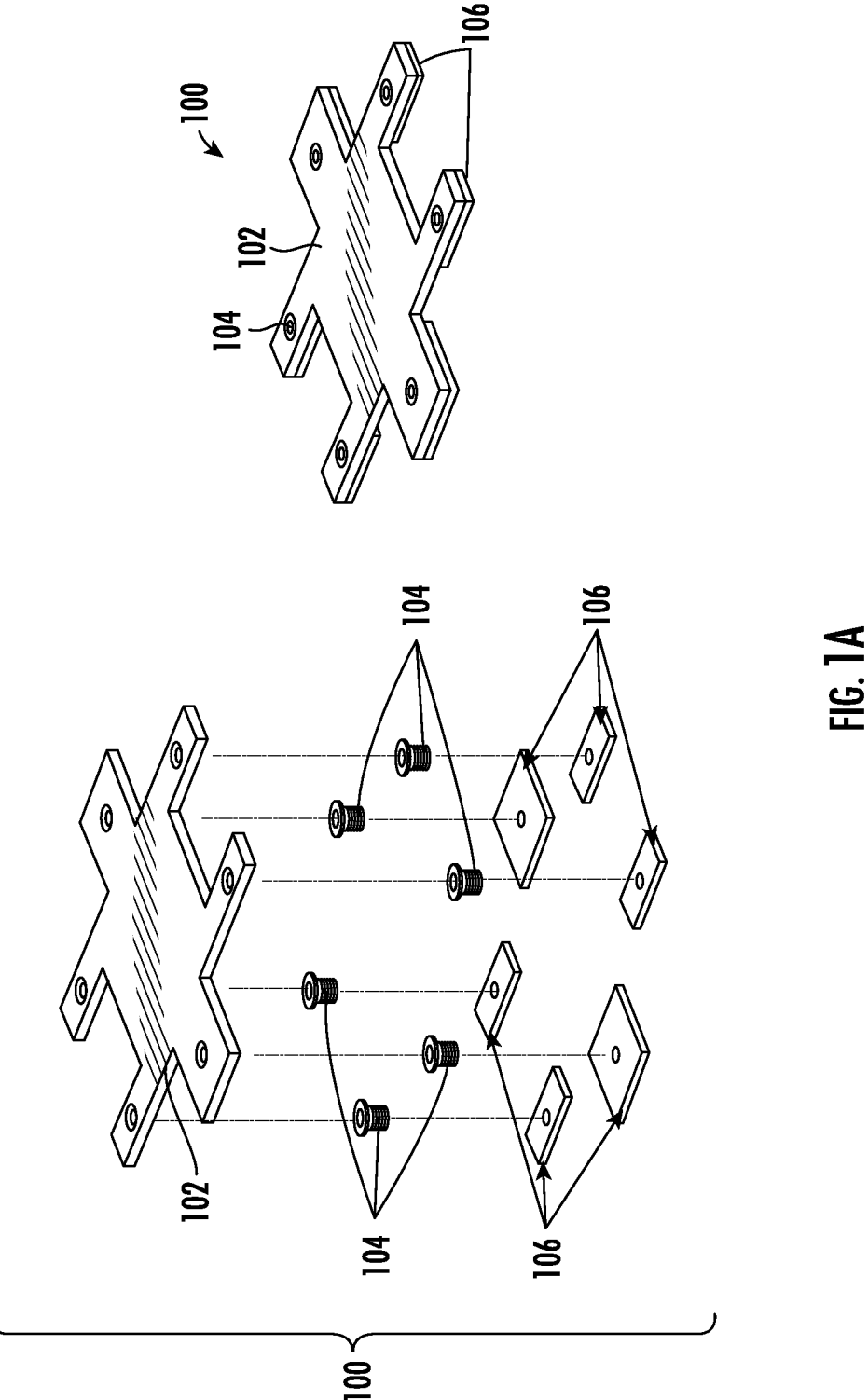
FIG. 1A is a schematic illustration of a removable lid assembly in accordance with some embodiments described herein.

Embodiments of the present disclosure will now be described more fully hereinafter with reference to the accompanying drawings, in which some, but not all, embodiments of the disclosure are shown. Indeed, the disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, printed circuit boards (PCBs) may refer to a structure used to connect electronic components to one another. PCBs may be configured in a number of ways and may be single-sided (one copper layer), double-sided (two copper layers), or multi-layer (outer and inner layers of copper as well as additional layers of copper alternating within layers of substrate). Electrical components may be fixed to conductive pads on the outer layer of a PCB. The conductive pads, in turn, may have a shape designed to accept the components' terminals to both electrically connect and mechanically attach the electrical components to the PCB. The electrical connection and mechanical attachment may further be accomplished by soldering (a process by which two items are connected using a melted conductive material) and/or using vias, which may refer to plated through-holes that allow interconnections between layers of the PCB.

As used herein, the term "substrate" may refer to the physical material that forms the structure and shape of a PCB. The characteristics of the substrate may affect how the PCB performs. The substrate may further electrically connect PCBs and semiconductor integrated circuit chips. The substrate material may be selected to configure the thermal, electrical, chemical, and mechanical properties of a PCB according to the requirements of the application in which the PCB will be used. The central region of the substrate may support a silicon die.

As used herein, the term "integrated circuit" or "IC" may refer to a set of electronic circuits on a small flat piece of semiconductor material performing the function of a larger circuit made from discrete components. The IC may further be defined as a circuit in which at least some of the circuit elements are inseparably associated and electrically interconnected so that the circuit is considered to be indivisible for the purpose of construction and usage. Furthermore, an IC die may refer to a block of semiconducting material on which a given functional circuit is fabricated.

As used herein, the term "package" may refer to a metal, plastic, glass, or ceramic casing containing one or more discrete semiconductor devices or ICs. The package may provide connections to an external environment such as a PCB via leads such as lands, balls, or pins. The package may also provide protection of the contained semiconductor devices or ICs against mechanical impact, chemical contamination, and light exposure.

As used herein, the terms "co-packaged optic" (or "CPO") and "co-packaged copper" (or "CPC") may refer to an advanced heterogeneous integration of either optics and silicon or copper and silicon, in which either integration may be implemented on a single packaged substrate. The CPO may utilize pluggable optical modules that include an optical engine (OE) to convert optical signals to electrical signals and electrical signals to optical signals. The CPO may further be comprised of an optical component on a photonics die and an electrical component on an electrical die.

As used herein, the reflow process may refer to attaching surface mounted components such as an IC package to a PCB wherein solder joints may be formed through preheating the components, PCB, and solder paste, then melting the solder. Bonding an IC to a substrate to form an IC package using a reflow process may cause the substrate to warp. In some cases, the reflow process may cause a mismatch between the coefficient of thermal expansion of the PCB and the substrate, leading to warpage of the substrate. Warpage of the substrate may thus cause variation in the surface of the substrate that may exceed a predetermined tolerance. The variation of the surface of the substrate may be measured in the "flatness" of the substrate, such as the flatness of a predetermined region bounded by two planes parallel to the surface of the substrate.

As used herein, a ball grid array (BGA) may be a type of surface-mount packaging used for integrated circuits. BGA packages use an array of metallic conductor balls arranged in a grid to permanently mount devices such as microprocessors on a PCB. The metallic conductor balls may then undergo the reflow process described above, wherein the metallic conductor balls may be preheated, then melted to bond the IC to a substrate to form an IC package.

As used herein, the term "flip chip (FC)" may refer to a method for interconnecting dies, such as semiconductor devices, IC chips, integrated passive devices, and microelectromechanical systems (MEMS), to external circuitry with solder bumps that have been deposited onto chip pads. The solder bumps may be deposited onto chip pads on the top side of the wafer during final wafer processing. The chip may be mounted to external circuitry (such as a circuit board or another chip or wafer) by "flipping" the chip, such that the chip's top side faces down and is positioned to allow the pads of the chip to align with matching pads on the external circuit. Solder is reflowed to complete the interconnect.

Conventional CPO packages may be incompatible with the BGA reflow process due to peripheral component placement, as peripheral component placement may limit the type of stiffener ring or support structure that can be used with the CPO package. Current CPO reflow processes may further use sockets, which limit the speed of IC-to-PCB communication and result in the application of strenuous forces on the CPO. The limited IC to PCB communication and strenuous forces may cause degradation of the functionality of the package and/or significant damage. Additionally, the reflow process may cause deformation of the substrate due to mismatched coefficients of thermal expansion of the IC die and the substrate. Deformation may further degrade connections and/or solder joints formed between the IC and substrate, as the deformation may create "non-wet" or "head on pillow bonds," which disconnect and/or weaken the connection of the IC to the substrate.

In order to address these issues and others, embodiments of the present invention are directed to a removable lid for IC packages, such as FC-BGA packages. As described in greater detail below, embodiments of the assembly include a lid that is configured to be reversibly secured to at least one pedestal that is attached to a substrate. Using the removable lid assembly reduces warpage of the substrate during the reflow process, as the lid structure adds strength and rigidity to the substrate material to counteract deformation caused by elevated temperatures experienced throughout the reflow process. Reduced deformation during the reflow process enables the formation of strong connections and/or solder joints between the IC and the substrate. Upon completion of the reflow process, the removable lid may be detached from the substrate. The removable lid may further reduce the time and material associated with conventional IC manufacturing processes, as processing of CPO packages, CPC packages, and other packages using a reflow process with varying coefficients of thermal expansion may be compatible with the BGA reflow process and eliminate the need to use a socket. In doing so, embodiments of the present invention can significantly increase the production quality of CPO or CPC products and produce a greater number of CPO or CPC products in the same amount of time.

With reference to FIG. 1A, a removable lid assembly 100 according to some embodiments is illustrated. As shown, the removable lid assembly 100 may comprise a lid 102, a plurality of fasteners 104, and at least one pedestal 106. The lid 102 may be configured to be reversibly secured to the at least one pedestal 106, as described below. The lid 102 may be made of a material that undergoes dimensional changes within a predetermined range when exposed to heat from the reflow process (e.g., a range that is smaller than the range of change otherwise experienced by the material of the substrate to which the removable lid assembly will be attached). The relatively limited dimensional change of the material of the lid 102 may result in limiting the possible warpage of the substrate 108 by keeping such warpage within established predetermined limits. Examples of materials that may be used to construct the lid 102 may include copper, steel, aluminum, carbon-based materials, ceramic-based materials, or other materials that may not undergo dimensional changes beyond a desired range of change.

Figure 1B:
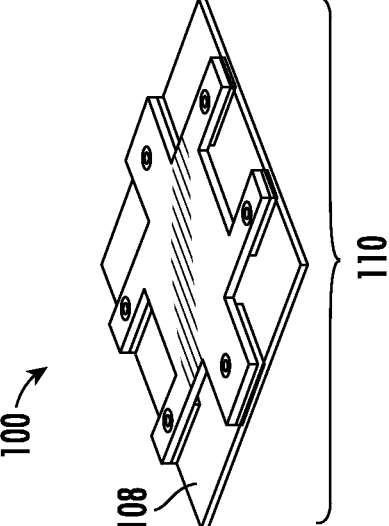
FIG. 1B is a schematic illustration of an integrated circuit package with the removable lid assembly attached in accordance with some embodiments described herein.
Figure 1B:
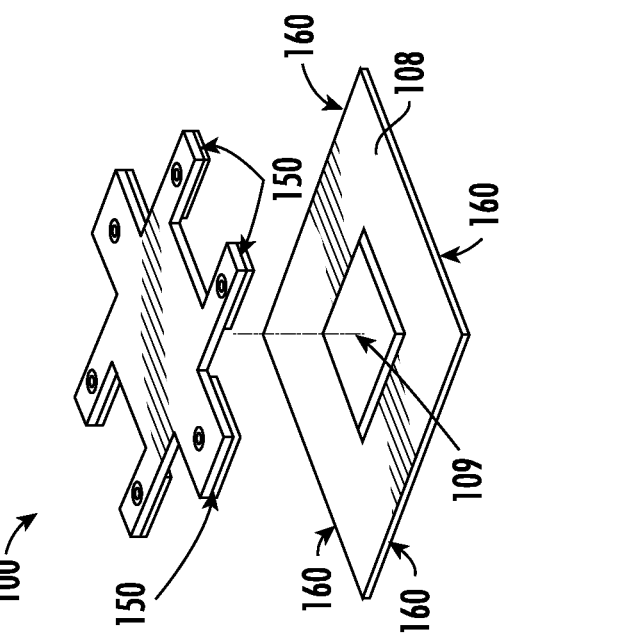

The at least one pedestal 106 may be configured to be attached to a substrate 108, such as the substrate 108 shown in FIG. 1B. In some cases, the at least one pedestal 106 may be attached to the substrate 108 (described below) prior to securing the lid 102 to the pedestal(s) 106. The substrate 108, in turn, may be configured to support electrical components, such as resistors, capacitors, diodes, transistors, and the like. The plurality of fasteners 104 may be configured to reversibly secure the lid 102 to the at least one pedestal 106. In this regard, the fasteners 104 may include bolts, screws, mechanical fasteners, or a combination of such fasteners and/or other types of fasteners.

In various embodiments, the at least one pedestal 106 may be one continuous pedestal or a plurality of pedestals, as described in greater detail below. In the case of one continuous pedestal 106, the continuous pedestal may be configured to extend to the outer edges 150 of the lid 102 and the outer edges 160 of the substrate 108. In other embodiments, the at least one pedestal 106 may be a plurality of pedestals, such as 2, 3, 4, or more pedestals. The at least one pedestal 106 (continuous or a plurality of pedestals) may be attached to the substrate 108, such as via adhesive. Each of the lid 102 and the at least one pedestal 106 may have attachment regions configured to allow the lid 102 to be secured to the pedestal(s). For example, the attachment regions may be corresponding areas of the lid 102 and the at least one pedestal 106 that define through holes that, when aligned, are configured (e.g., sized and shaped) to receive a fastener therethrough. The through holes may, for example, be threaded or unthreaded. In such embodiments, the lid 102 may be placed on the at least one pedestal 106, such that the corresponding attachment regions are aligned and the plurality of fasteners 104 may be used to secure the lid 102 to the at least one pedestal 106 by inserting the fasteners into the through holes, thereby forming the removable lid assembly 100. The securement of the lid 102 to the at least one pedestal 106 using the plurality of fasteners 104 may be a reversible securement, in that the lid 102 and the plurality of fasteners 104 may be removed from the at least one pedestal 106, such as by undoing or removing the plurality of fasteners 104.

With continued reference to FIGS. 1A and 1B, in an installed state of the removable lid assembly 100, in which the removable lid assembly 100 is attached to the substrate 108, the removable lid assembly 100 may enhance the stiffness of the substrate 108. With the enhanced stiffness of the substrate 108 imparted by the removable lid assembly 100, warpage that may otherwise be experienced by the substrate 108 during a reflow process (e.g., using conventional systems and processes) may be reduced. At the same time, however, in the installed state, the lid 102 is spaced from the electrical components of the substrate 108, which allows better access to the electrical components for testing and thermal management, as described in greater detail below.

With reference to FIG. 1B and as noted above, the removable lid assembly 100 may be attached to the substrate 108 through the at least one pedestal 106 to form the IC package 110. In this embodiment, the main die located on the substrate 108 may undergo the FC process, after which the removable lid 102 may be attached to the substrate 108. The main die may be located in the central portion 109 of the substrate 108. The at least one pedestal 106 may be attached to the substrate 108 through an adhesive substance, mechanical bond, or other form of attachment that may be able to endure the heat from the reflow process. As noted above, in various embodiments, the at least one pedestal 106 may be configured to be bonded to the substrate 108 prior to the lid 102 being reversibly secured to the at least one pedestal 106. The at least one pedestal 106 may, for example, be bonded to the substrate 108 before the lid 102 and the plurality of fasteners 104 are applied. In such embodiments, the at least one pedestal 106 may be bonded to the substrate 108, then the lid 102 may be placed on the corresponding predetermined attachment regions of the at least one pedestal 106. The plurality of fasteners 104 may then be inserted into through holes or otherwise used to reversibly secure the lid 102 to the at least one pedestal 106, as described above. The removable lid assembly 100 may further enable electrical probing of the substrate 108 while in the installed state. Electrical probing may occur on surfaces of the substrate 108 that remain uncovered despite installation of the removable lid assembly 100.

In various embodiments, the at least one pedestal 106 may be configured to be removed from the substrate 108 following application of the reflow process. For example, after removal of the lid 102 from the at least one pedestal 106, the at least one pedestal may also be removed from the substrate 108, such as by dissolving the adhesive substance bonding the at least one pedestal to the substrate, removing the mechanical bond, or otherwise removing the attachment utilized to bond the at least one pedestal to the substrate.

With further reference to FIG. 1B, in various embodiments, the removable lid assembly 100 may be configured to contact or overlie the central portion 109 of the substrate 108. Contact with the central portion 109 of the substrate 108 may result in constraining warpage of the substrate 108, particularly in the central region 109. In various other embodiments, the lid 102 may cover the central portion 109 of the substrate 108 but may not contact the lid itself. In such cases, while still enhancing the overall stiffness of the substrate 108, the lid assembly 100 may not as effectively constrain warpage directed towards the central region 109 of the substrate 108. In still other embodiments, the lid 102 may not contact or cover the central region 109 of the substrate 108. The central portion 109 of the substrate 108 may refer to a portion of the substrate 108 that may be modified during the manufacturing process. For example, the central portion 109 of the substrate 108 may include the main die, the IC die, the silicon center, or additional components of the substrate 108 located in or near the center of the substrate. The configuration of the lid assembly 100 may thus ensure that the lid 102 is spaced from the substrate 108 and any electrical components supported by the substrate.

Figure 1C:
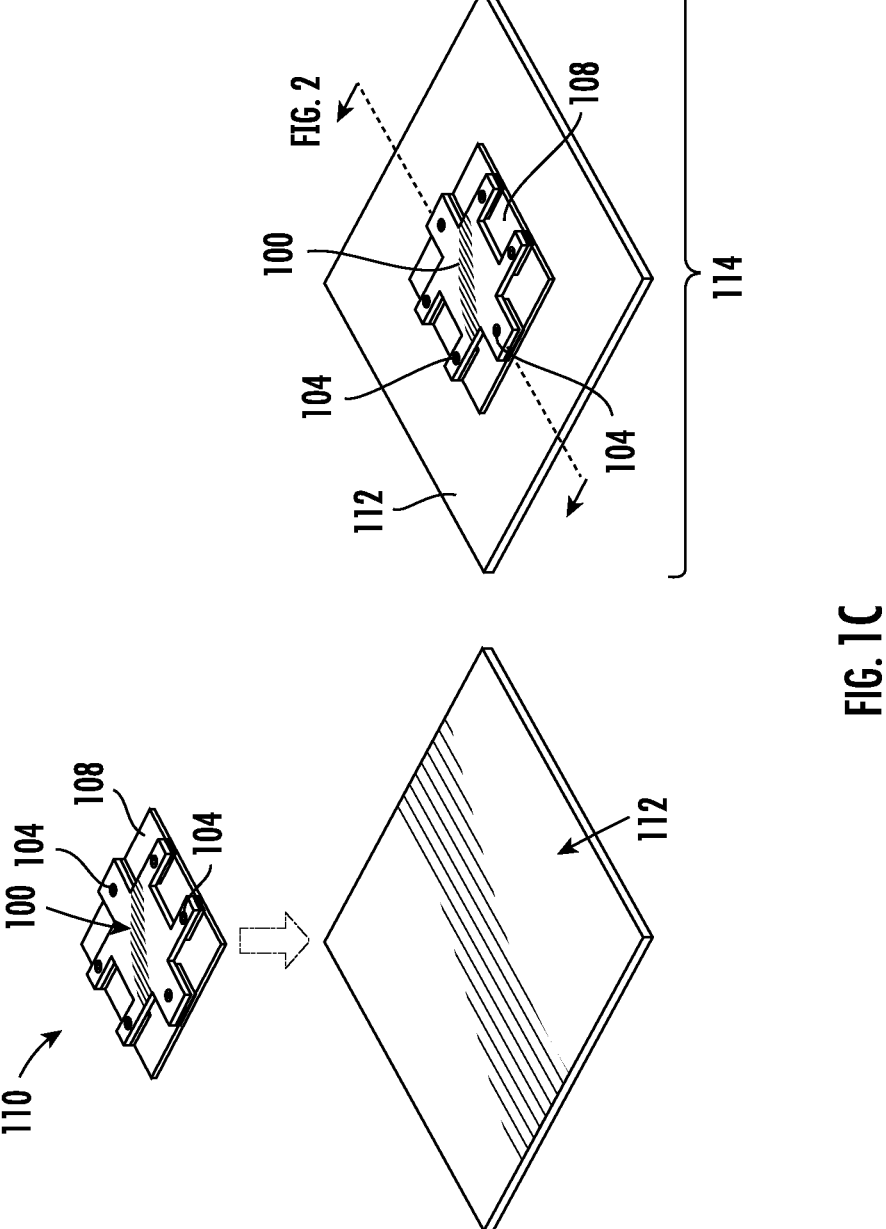
FIG. 1C is a schematic illustration of an integrated circuit package with the removable lid assembly being further attached to a PCB through a reflow process to form a reflowed integrated circuit package in accordance with some embodiments described herein.

With reference to FIG. 1C, the IC package 110 with the lid assembly 100 installed may be bonded to a PCB 112 in a reflow process. In various embodiments, the reflow process may be a BGA reflow process, wherein the IC package 110 is bonded to the PCB 112 through the placement of metallic balls 303 (shown in FIGS. 3A and 3B and described below) arranged in an array or grid-like formation. The reduced warpage of the substrate 108 during the reflow process due to the attachment of the removable lid assembly 100 may enable the IC package 110 to be bonded to the PCB 112 with a reduced number of defects.

Figure 2:
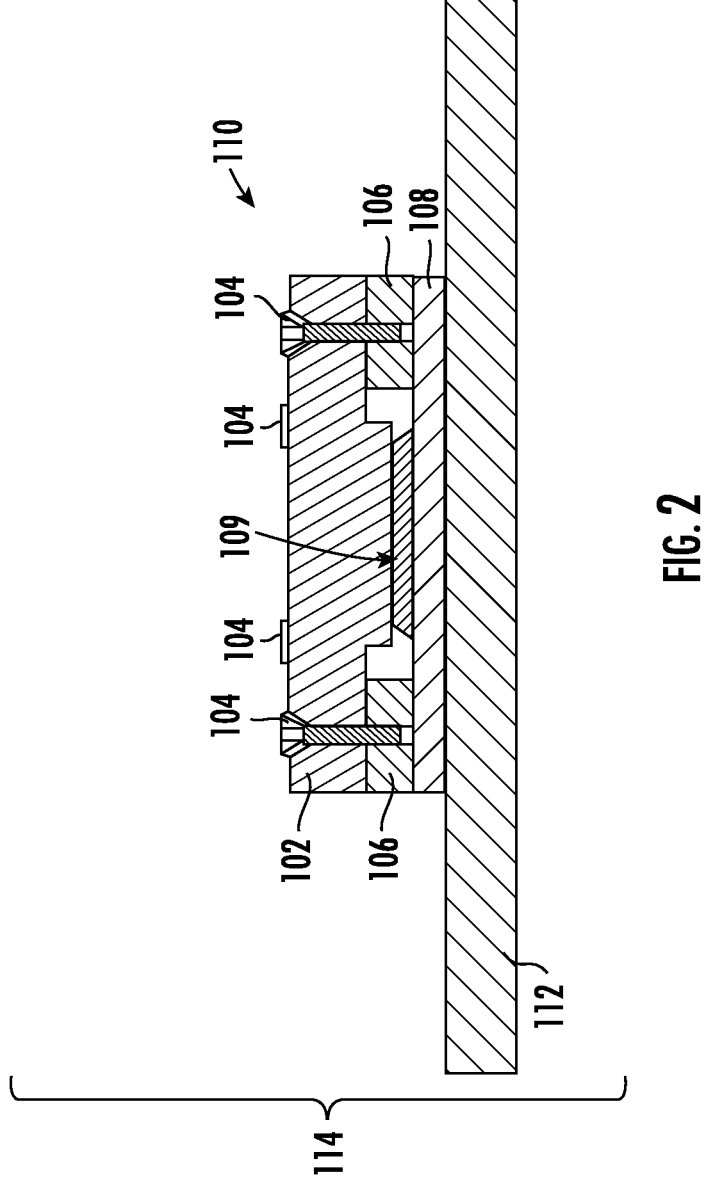
FIG. 2 is a cross-sectional view of the integrated circuit package of FIG. 1C, with the removable lid assembly installed, in accordance with some embodiments described herein.

For example, FIG. 2 shows a cross-sectional view of a reflowed IC package 200 (e.g., the IC package 110 after having undergone the reflow process) according to some embodiments is illustrated. The IC package 110 in the installed state may include the lid 102, the plurality of fasteners 104, at least one pedestal 106, and the substrate 108. Following reflow, the IC package 110 may be attached and in electrical communication with the PCB 112 to form an electrical apparatus 114. In other words, the reflow process may be used to create the attachment and electrical communication of the IC package 110 to the PCB 112, thereby causing the IC package 110 to be bonded to the PCB 112 to form the electrical apparatus 114. The bonding of the IC package 110 to the PCB 112 through a reflow process may be conducted using a BGA reflow process, wherein an array of metallic conductor balls 303 may be placed between the PCB 112 and the IC package 110. Heat may be applied in the reflow process, melting the metallic conductor balls 303 and thus creating a bond between the PCB 112 and the IC package 110.

Figure 3A:
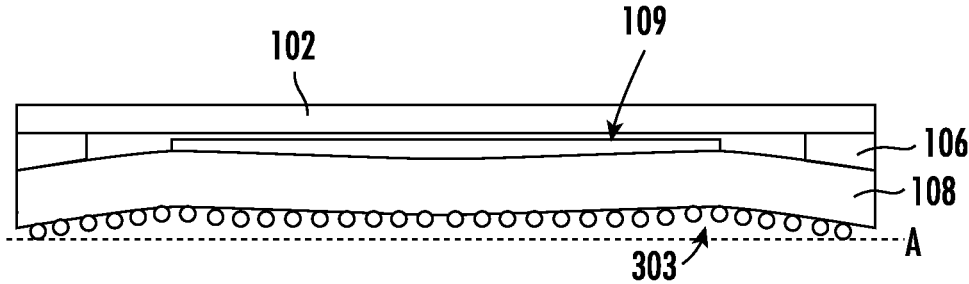
FIG. 3A is a schematic illustration of an integrated circuit package with the removable lid assembly attached undergoing the reflow process in accordance with some embodiments described herein.
Figure 3B:
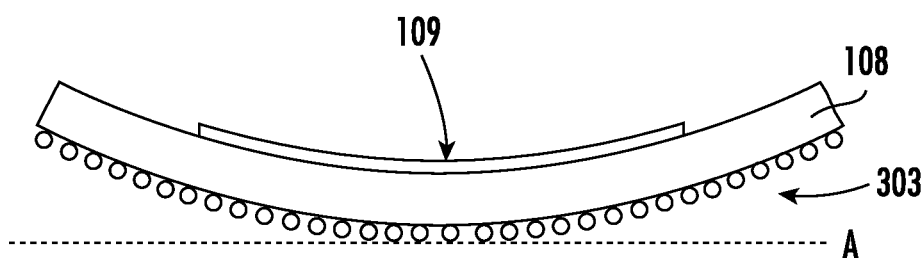
FIG. 3B is a schematic illustration of an integrated circuit package without the removable lid assembly attached undergoing the reflow process.

Referring now to FIG. 3A-3B, warpage of the substrate 108, such as under conventional methods in which the removable lid assembly 100 of the embodiments described herein are not used, may result in defects in the finished electrical apparatus 114 (shown in FIGS. 1C and 2). Such defects may include disconnects between one or more of the metallic balls 303 used in the BGA reflow process and the corresponding contact areas of the PCB 112 to which the IC package 110 is applied, as the disconnects or other defects cause the substrate 108 of the IC package 110 and the PCB 112 to have areas where the proper connections are not made.

As depicted in FIG. 3B, for example, for a substrate 108 undergoing BGA reflow without a removable lid assembly 100 in place (e.g., under conventional methods), heat from the reflow process may cause the sides of the substrate 108 to warp upward, creating a curved substrate 108 as shown. The resulting curvature of the substrate 108 may cause defects in the resulting CPO/CPC product 120, as certain areas of the substrate 108 may be spaced from corresponding areas of the PCB 112, precluding an electrical connection between the two via the metallic conductor balls 303. In other words, the substrate 108 as shown in FIG. 3B may not properly bond to the IC package as the undesired curvature of the substrate 108 deviates from an ideal reference plane A. The deviation from the reference plane A may thus prevent the reflow process from fully attaching the substrate 108 to the PCB 112. In contrast, according to embodiments of the present invention in which a removable lid assembly 100 is used as described above, the substrate 108 undergoing reflow as represented in FIG. 3A experiences reduced warpage in the BGA reflow process due to the constraints provided by the lid 102. Due to the stiffness imparted by the lid 102 in FIG. 3A, the substrate 108 is constrained to maintain a more planar structure, thereby aligning more closely with the reference plane A shown. The alignment of the substrate 108 with the reference plane A enables a greater proportion of the metallic conductor balls 303 that are arranged between the substrate 108 and the PCB 112 to come into contact and thus provide for a more complete and robust attachment between the substrate 108 and the PCB 112.

Figure 1D:
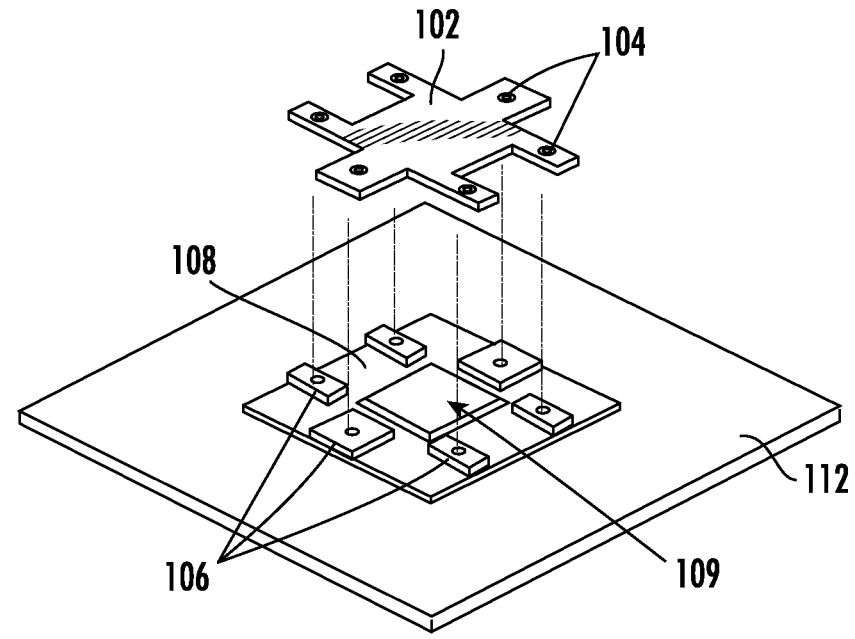
FIG. 1D is a schematic illustration showing removal of the lid from the reflowed integrated circuit package in accordance with some embodiments described herein.

With reference to FIG. 1D, in some cases it may be desirable to remove the lid 102 from the IC package 110 (e.g., undo the fasteners 104 to remove the lid 102 from the pedestal(s) 106), thereby only leaving the pedestal(s) 106 attached to the substrate 108, which is in turn attached to the PCB 112. The removal of the lid 102 may occur after the reflow process represented in FIG. 1C has concluded. Upon removal of the lid 102 and the plurality of fasteners 104 from the reflowed electrical apparatus 114, a CPO/CPC product 120 (shown in FIG. 1E) may be formed, as described below. In some cases, however, the CPO/CPC product 120 may be formed with the lid 102 in place (e.g., remaining secured to the pedestal(s) 106), depending on the configuration of the lid (e.g., the size and shape of the lid), as described in greater detail below.

Figure 1E:
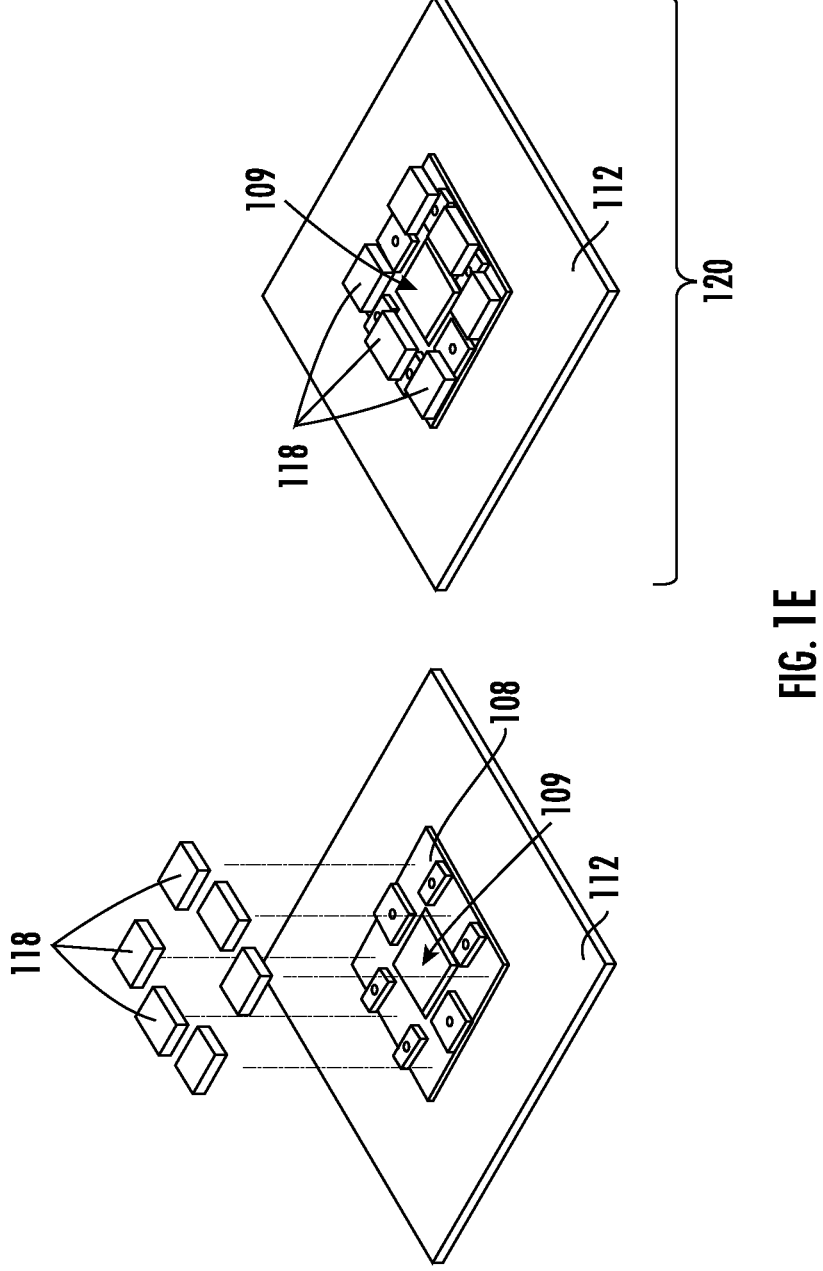
FIG. 1E is a schematic illustration of the reflowed integrated circuit package with peripheral components installed to form a CPO/CPC Product in accordance with some embodiments described herein.

With reference to FIG. 1E, the CPO/CPC product 120 may be formed by installing peripheral components 118 onto the areas of the electrical apparatus 114. The peripheral components 118 may vary, depending on the desired functionality of the resulting CPO/CPC product but in some cases may include components such as sockets, silicon dies, screws, heat dissipation structures, etc. As a result of embodiments of the present invention described herein, the reflow process may be performed on the PCB 112 to secure the PCB to the substrate 108, as opposed to traditional methods wherein a socket would be required to enable reflow on the PCB 112 and assembly of the IC occurs after the use of the socket.

Figure 4:
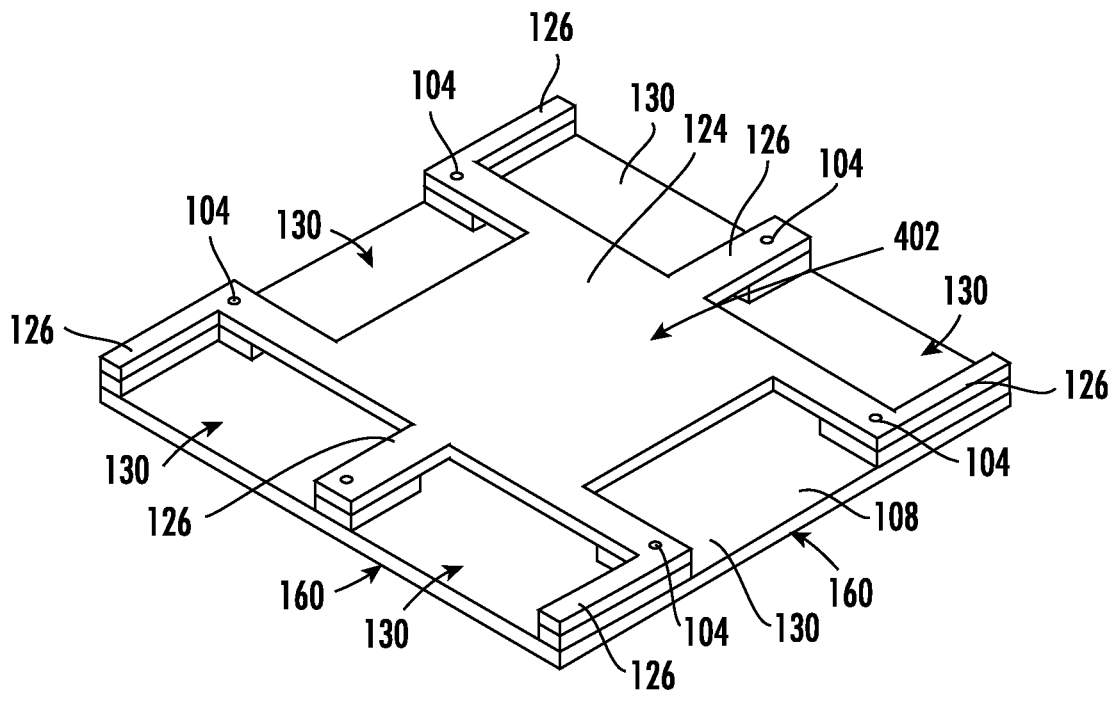
FIG. 4 is a schematic illustration showing the removable lid assembly in the installed state partially covering the substrate in accordance with some embodiments described herein.
Figure 5:
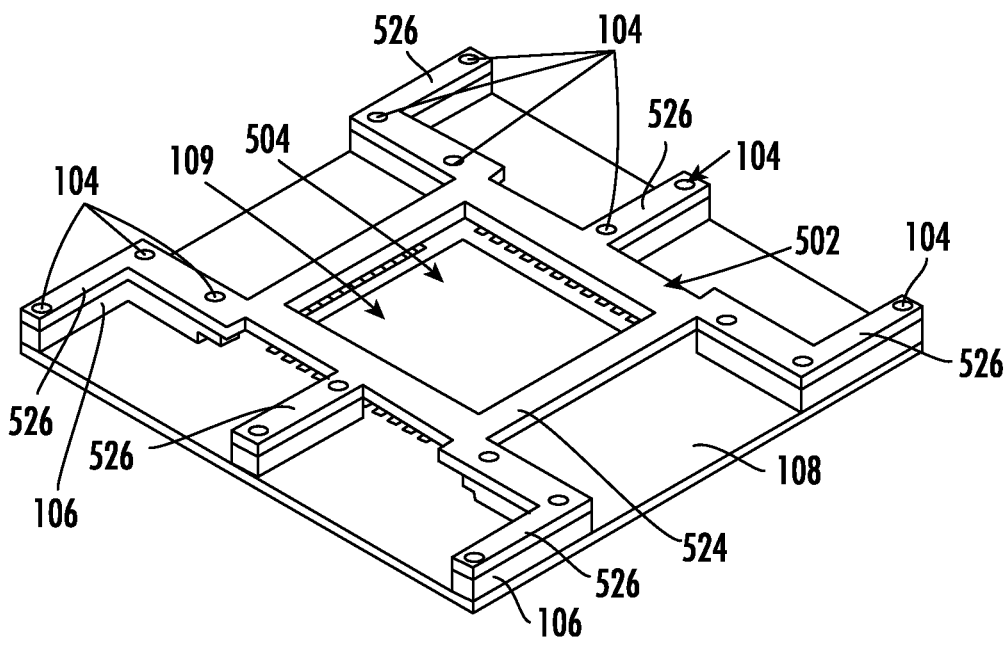
FIG. 5 is a schematic illustration showing the removable lid assembly in the installed state with a central body configured to overlie and allow access to a central portion of the substrate in accordance with some embodiments described herein.
Figure 6:
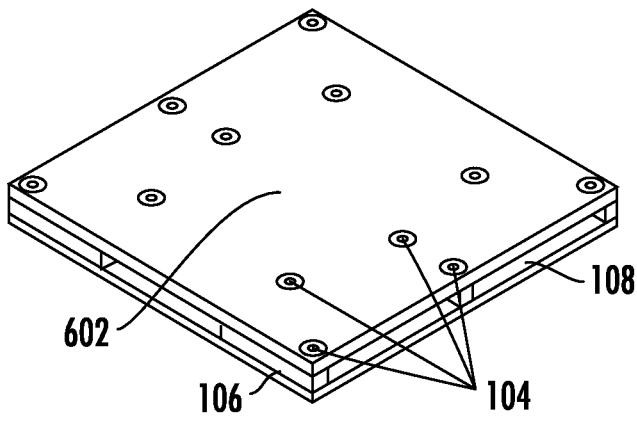
FIG. 6 is a schematic illustration showing the removable lid assembly in the installed state fully covering the substrate in accordance with some embodiments described herein.

Referring now to FIGS. 4-6, various configurations of the lid are illustrated. In FIG. 4, a lid 402 is depicted that at least partially covers the substrate 108. In this embodiment, the lid 402 may define a central body 124 and a plurality of support members 126 extending from the central body. The configuration of the plurality of support members 126 (e.g., the size and shape) may be configured to enable electrical probing in predetermined areas 130 of the substrate 108. Electrical probing in predetermined areas 130 may include direct or indirect electrical touching, testing to ensure components are functioning properly, or modifications to the substrate 108. The plurality of support members 126 may further be configured to extend to an outer edge 160 of the substrate 108 when the lid 402 is attached to the substrate 108. In such embodiments, the lid 402 may be configured to overlie the central portion of the substrate 109 (shown in FIG. 1B). The lid 402 may directly contact the central portion 109 of the substrate 108 to constrain warpage in some embodiments, as described above. In other embodiments, while the lid 402 may cover the central portion 109 of the substrate 108, the lid 402 may not directly contact the central portion 109.

Referring now to FIG. 5, another configuration of the lid 102 is provided. In the depicted embodiment, a lid 502 is shown in which the central body 524 defines a central opening 504. The central opening 504 may further allow access to a central region of the substrate 108, such as all or at least part of the central portion 109 described above. As described in connection with FIG. 4, the lid 502 may further define a plurality of support members 526 extending from central body 524. The lid 502 having the central opening 504 may thus enable modifications to be made to the substrate 108 and may further enable modifications to the central portion 109 of the substrate 108. The central opening 504 may further enable heat dissipation from the IC package 110 in addition to heat dissipation from predetermined areas 130 of the substrate 108. Heat dissipation may further be achieved through application of a coolant solution that may be applied to the central portion 109 of the substrate 108 through the central opening 504. The lid 502 may thus enable various methods of heat dissipation.

In some cases, the lid 102 may be configured so as to fully cover the substrate 108, as shown with the lid 602 depicted in FIG. 6. The lid 602 may directly contact the central portion 109 of the substrate 108 and may constrain warpage through direct contact. In other embodiments, the lid 602 may cover the central portion 109 of the substrate 108 but may not make direct contact with the central portion of the substrate 109. In some cases, the lid 602 as shown in FIG. 6 may be used to impart greater strength and rigidity to the substrate 108, as a great area of the substrate is covered and constrained.

Figure 7:
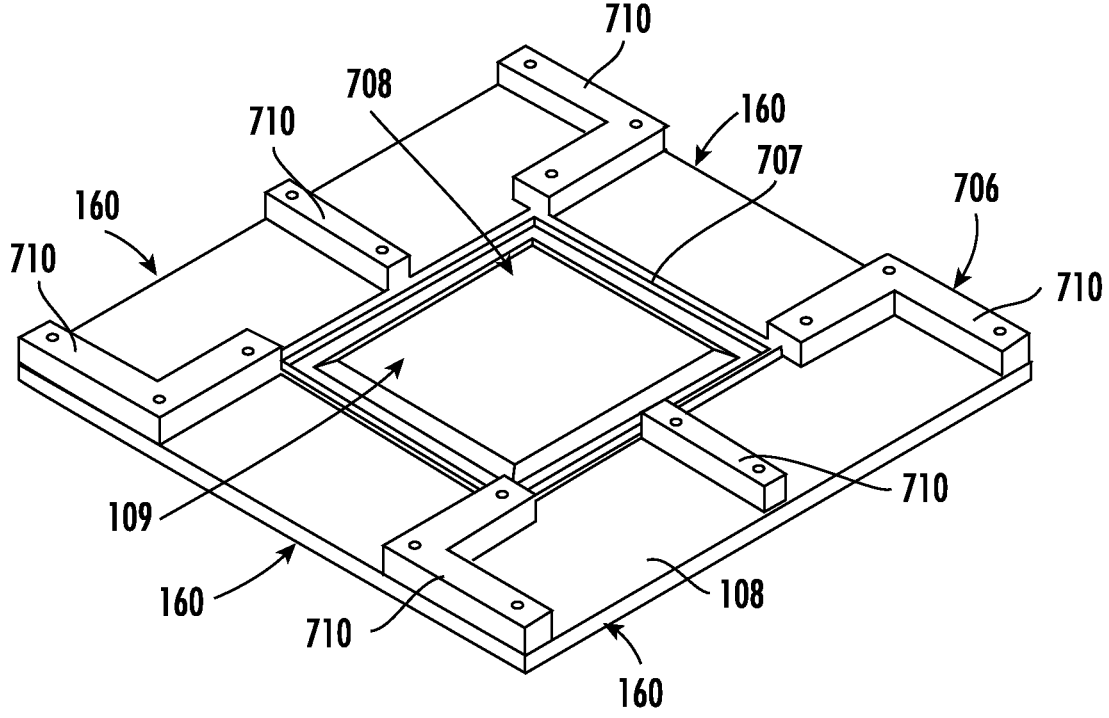
FIG. 7 is a schematic illustration of a single continuous pedestal attached to the substrate in accordance with some embodiments described herein.
Figure 8:
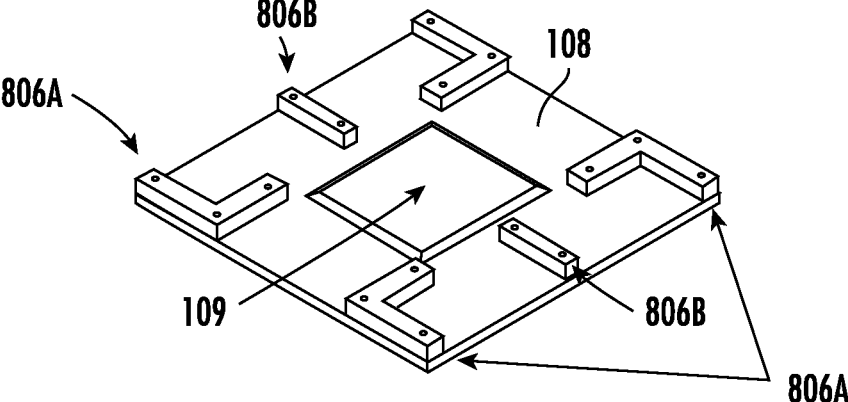
FIG. 8 is a schematic illustration of a plurality of pedestals attached to the substrate in accordance with some embodiments described herein.

Referring now to FIGS. 7 and 8, the at least one pedestal may be configured (e.g., sized and shaped) in a variety of ways to support different configurations of the lid and/or to allow access to different parts of the substrate, as well as for other design and manufacturing reasons. In FIG. 7, the at least one pedestal 706 is a single continuous pedestal that is attached to the substrate. The pedestal 706 may comprise a central body 707 that defines an opening 708 configured to overlie and allow access to the central portion 109 of the substrate 108 when the lid 102 is installed. The pedestal 706 may further comprise support members 710 that are configured to extend to the outer edges 160 of the substrate 108. The pedestal 706 may be reversibly attached to the substrate 108 through the use of an adhesive substance as described previously. In some embodiments, different portions of the pedestal 706 may have different dimensions, such as shorter or thinner parts. For example, the central body 707 may be configured to be thinner (e.g., have a shorter height) than the support members 710, as depicted. The dimensions of the pedestal 706 may be configured to support the lid 102 and/or an embodiment seen in 402, 502, 602, and at the same time provide access to predetermined areas 130 of the substrate 108 (shown in FIG. 4). The pedestal 706 may further be configured to have attachment regions located to correspond with and accommodate the lid 102 and the embodiments seen in 402, 502, 602 and the areas of the substrate 108 in which modifications may be performed.

In FIG. 8, the at least one pedestal comprises a plurality of pedestals. In such embodiments, the pedestals may have uniform dimensions (be sized and shaped the same) or may be different. In FIG. 8, for example, the plurality of pedestals includes L-shaped pedestals 806A and I-shaped pedestals 806B. In addition to the shapes of the plurality of pedestals seen in 806A and 806B, the plurality of pedestals may further include T-shaped, U-shaped, or square-shaped pedestals, or pedestals having a variety of other predetermined shapes that may support and/or provide access to areas of the substrate 108 or the central portion 109 of the substrate. The size and shape of the plurality of pedestals 106 may be selected based on the dimensions and/or configuration of the substrate 108 to which they are attached and the areas of the substrate 108 that may be modified or may need to be accessible. The pedestals 806A and 806B may be arranged on the substrate 108 in a number of ways, as determined based on the desired structure and/or function of the resulting product. The plurality of pedestals 106 may thus be configured to support the removable lid assembly 100 on the substrate 108 and avoid contacting electrical components on the substrate. The placement of the plurality of pedestals 106 may further be configured to enable electrical probing to occur in predetermined areas 130 of the substrate 108. The plurality of pedestals 106 may be configured to be reversibly installed on the substrate 108, as described above.

Figure 9:
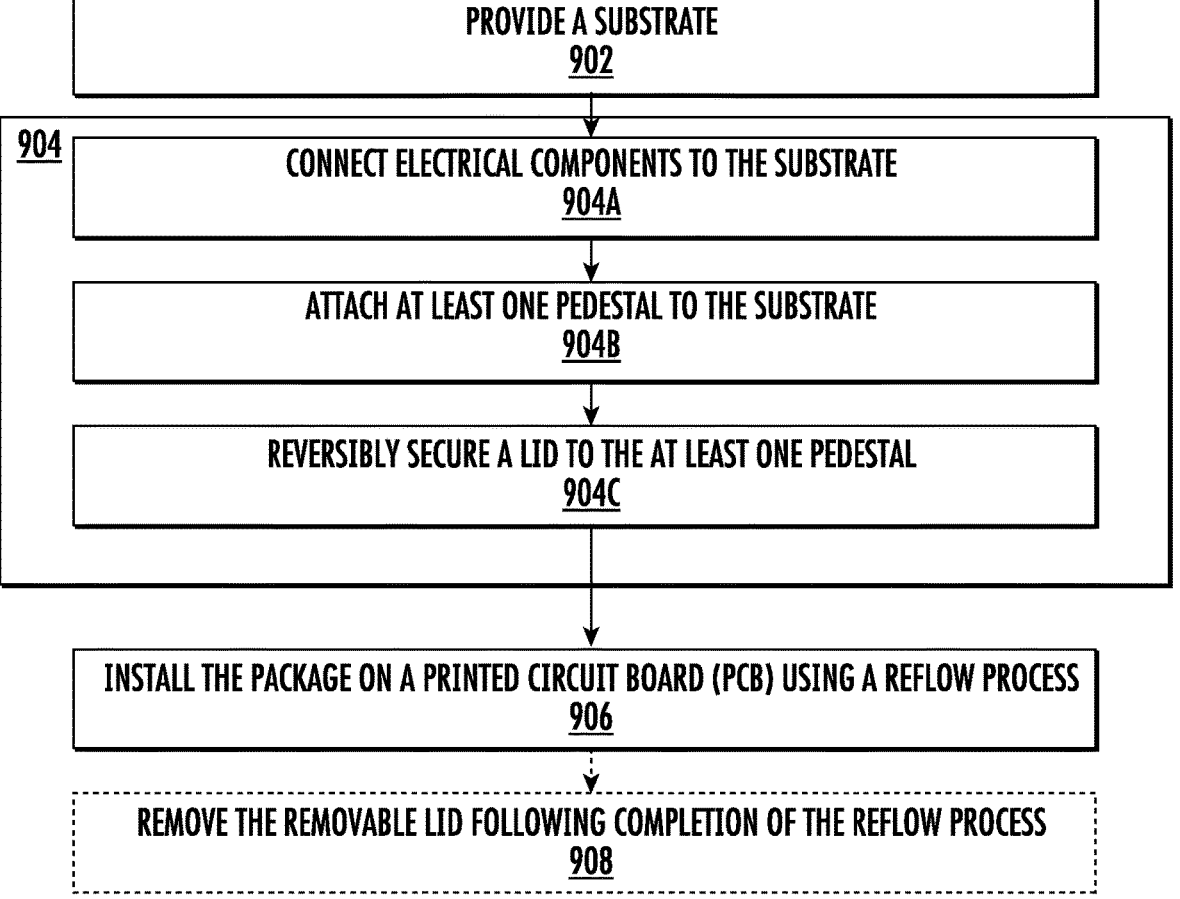
FIG. 9 is a flowchart illustrating a method of manufacturing an electronic apparatus using a removable lid assembly according to some embodiments herein.

Referring now to FIG. 9, a flowchart illustrating a method of manufacturing an electronic apparatus such as a CPO/CPC product is shown. The method 900 may comprise providing a substrate (Block 902), such as the substrate 108 described above. An IC package may be assembled at Block 904. The IC package may be assembled by connecting electrical components to the substrate (Block 904A), attaching at least one pedestal to the substrate (Block 904B), and reversibly securing a lid to the at least one pedestal (Block 904C). The electrical components connected to the substrate may be components mechanically attached and/or electronically connected to the substrate during the manufacturing process of the IC package. The at least one pedestal that is attached (e.g., bonded) to the substrate may in some cases be removable from the substrate, as described above. Furthermore, the at least one pedestal may be a single continuous pedestal or a plurality of pedestals that are attached to the substrate. The at least one pedestal may further be configured to reversibly secure a lid to the at least one pedestal. The at least one pedestal may reversibly secure the lid to the substrate to enhance the stiffness of the substrate while undergoing a reflow process and may thereby reduce warpage of the substrate, as described above. The IC package may then be installed on a printed circuit board, such as through a reflow process (Block 906). The reflow process may be a FC-BGA reflow process that is used to install the IC package on the PCB. The reflow process may comprise a reflow process that is applicable for both CPO and CPC products. The lid may be removed from the at least one pedestal upon completion of the reflow process (Block 908), as described above.

As described above, the lid may have various configurations, depending on a number of factors. In some cases, the lid may define a central body and plurality of support members extending from the central body. The plurality of support members may be configured to extend to an outer edge of the substrate. The placement of the support members of the central body may be configured to enable electrical probing in predetermined areas of the substrate and to avoid contacting electrical components on the substrate, as described above.

Accordingly, a system is described herein that facilitates and supports a BGA reflow process for forming an IC package. As described above, the system may include a substrate, electrical components supported by the substrate, and a removable lid assembly attached to the substrate. As seen in FIG. 1A-1E, the removable lid assembly 100 may include at least one pedestal 106 that is configured to be attached to the substrate 108. The at least one pedestal 106 may have various configurations, including those shown and described in connection with FIGS. 1, 7, and 8. The removable lid assembly 100 may further include a lid 102 that may be reversibly secured to the at least one pedestal 106 through a plurality of fasteners 104. Various configurations of the lid 102, as shown and described in FIGS. 4, 5, 6, may be used depending on the particular design and functional requirements of the resulting CPO/CPC product and/or manufacturing and testing requirements. The substrate 108, the electrical components supported by the substrate, and the removable lid assembly 100 may form an IC package 110. As such, in some embodiments of the system, the lid 102 may be spaced from the electrical components, and the removable lid assembly 100 may enhance a stiffness of the IC package. The enhanced stiffness of the IC package 110 may reduce warpage of the substrate 108 during the reflow process applied to the IC package, as described above.

The system may further include a PCB. In this regard, the IC package may be configured to be attached to and in electrical communication with the PCB, such as through the BGA reflow process described above. Upon completion of the reflow process, the lid may be removed from the removable lid assembly after the IC package has been attached to the PCB.

As will be appreciated by one of ordinary skill in the art, the present disclosure may be embodied as an apparatus (including, for example, a system, a machine, a device, a computer program product, and/or the like), as a method (including, for example, a business process, a computer-implemented process, and/or the like), as a computer program product (including firmware, resident software, micro-code, and the like), or as any combination of the foregoing. Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of the disclosures herein. In addition, the method described above may include fewer steps in some cases, while in other cases may include additional steps. Modifications to the steps of the method described above, in some cases, may be performed in any order and in any combination.

Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A removable lid assembly for an integrated circuit (IC) package comprising:

at least one pedestal configured to be attached to a substrate, wherein the substrate is configured to support electrical components;

a lid configured to be reversibly secured to the at least one pedestal; and a plurality of fasteners configured to reversibly secure the lid to the at least one pedestal, wherein, in an installed state of the removable lid assembly in which the removable lid assembly is attached to the substrate, the lid is spaced from the electrical components of the substrate, and wherein, in the installed state, the removable lid assembly enhances a stiffness of the substrate, thereby reducing warpage of the substrate during a reflow process applied to the substrate.

2. The removable lid assembly of claim 1, wherein the lid at least partially covers the substrate in the installed state.

3. The removable lid assembly of claim 2, wherein the lid defines a central body and a plurality of support members extending from the central body, wherein the plurality of support members is configured to extend to an outer edge of the substrate in the installed state.

4. The removable lid assembly of claim 3, wherein the central body of the lid defines an opening configured to overlie and allow access to a central portion of the substrate in the installed state.

5. The removable lid assembly of claim 3, wherein the central body of the lid is configured to constrain warpage of a central portion of the substrate in the installed state through direct contact.

6. The removable lid assembly of claim 1, wherein the lid fully covers the substrate in the installed state.

7. The removable lid assembly of claim 1, wherein the at least one pedestal comprises a plurality of pedestals.

8. The removable lid assembly of claim 1, wherein the at least one pedestal is configured to be bonded to the substrate prior to the lid being reversibly secured to the at least one pedestal.

9. The removable lid assembly of claim 1, wherein the at least one pedestal is configured to be removed from the substrate following application of the reflow process.

10. The removable lid assembly of claim 1, wherein the removable lid assembly is compatible with co-packaged optic (CPO) and co-packaged copper (CPC) packages.

11. The removable lid assembly of claim 1, wherein the reflow process is a ball grid array (BGA) reflow process.

12. A method for manufacturing an electronic apparatus, comprising:

providing a substrate;

assembling an integrated circuit (IC) package by:

connecting electrical components to the substrate;

attaching at least one pedestal to the substrate;

using a plurality of fasteners to reversibly secure a lid to the at least one pedestal, wherein the at least one pedestal, the lid, and the plurality of fasteners form a removable lid assembly; and installing the IC package on a printed circuit board (PCB) using a reflow process, wherein the removable lid assembly enhances a stiffness of the substrate, thereby reducing warpage of the substrate during the reflow process that is applied to the substrate.

13. The method of claim 12, wherein the reflow process comprises a reflow process for co-packaged optics (CPO) and co-packaged copper (CPC).

14. The method of claim 12, wherein the removable lid assembly is configured to constrain warpage of the IC package.

15. The method of claim 12 further comprising removing the plurality of fasteners and the lid following completion of the reflow process.

16. The method of claim 12, wherein the lid defines a central body and a plurality of support members extending from the central body, wherein the plurality of support members is configured to extend to an outer edge of the substrate.

17. The method of claim 12, wherein the at least one pedestal is configured to be bonded to the substrate prior to the lid being reversibly secured to the at least one pedestal.

18. A system configured to enable ball grid array (BGA) reflow on an IC package, the system comprising:

a substrate;

electrical components supported by the substrate; and a removable lid assembly attached to the substrate, wherein the removable lid assembly comprises:

at least one pedestal configured to be attached to the substrate;

a lid configured to be reversibly secured to the at least one pedestal; and a plurality of fasteners configured to reversibly secure the lid to the at least one pedestal, wherein the substrate, the electrical components, and the removable lid assembly form an IC package, wherein the lid is spaced from the electrical components, and wherein the removable lid assembly enhances a stiffness of the IC package, thereby reducing warpage of the substrate during a reflow process applied to the IC package.

19. The system of claim 18 further comprising a printed circuit board (PCB), wherein the IC package is configured to be attached to and in electrical communication with the PCB.

20. The system of claim 18, wherein the lid is removed from the removable lid assembly following attachment of the IC package to the PCB.

* * * * *